United States Patent
Suzuki

(10) Patent No.: US 10,586,578 B2
(45) Date of Patent: Mar. 10, 2020

(54) STORAGE DEVICE, INFORMATION PROCESSING APPARATUS, AND STORAGE DEVICE CONTROL METHOD

(71) Applicant: SONY CORPORATION, Tokyo (JP)

(72) Inventor: Tetsuhiro Suzuki, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/078,892

(22) PCT Filed: Jan. 23, 2017

(86) PCT No.: PCT/JP2017/002120
§ 371 (c)(1),
(2) Date: Aug. 22, 2018

(87) PCT Pub. No.: WO2017/154382
PCT Pub. Date: Sep. 14, 2017

(65) Prior Publication Data
US 2019/0051338 A1    Feb. 14, 2019

(30) Foreign Application Priority Data
Mar. 11, 2016    (JP) .................. 2016-047986

(51) Int. Cl.
*G11C 11/16* (2006.01)
*G11C 11/15* (2006.01)
*G11C 13/00* (2006.01)

(52) U.S. Cl.
CPC ............ *G11C 11/15* (2013.01); *G11C 11/161* (2013.01); *G11C 11/1673* (2013.01);
(Continued)

(58) Field of Classification Search
CPC ........ G11C 11/1673; G11C 7/062; G11C 7/14
(Continued)

(56) References Cited

U.S. PATENT DOCUMENTS 6,807,088 B2 * 10/2004 Tsuchida ................. G11C 11/15
                                                            365/158
7,453,719 B2 * 11/2008 Sakimura ................ G11C 11/15
                                                            365/158

(Continued)

FOREIGN PATENT DOCUMENTS

JP    2009-187631    8/2009
JP    2013-516725    5/2013

OTHER PUBLICATIONS

International Search Report prepared by the Japan Patent Office dated Feb. 7, 2017, for International Application No. PCT/JP2017/002120.

*Primary Examiner* — Son L Mai
(74) *Attorney, Agent, or Firm* — Sheridan Ross P.C.

(57) ABSTRACT

To accurately read data in a storage device provided with a cell having a variable resistance value. In a reference cell circuit, a resistance value changes to a predetermined initial value when an initialization signal exceeding a predetermined reversal threshold is input. A reference side signal source inputs a reference side read signal of a predetermined value not exceeding the predetermined reversal threshold to the reference cell circuit after the initialization signal is input to the reference cell circuit when there is an instruction to read with respect to a memory cell. A cell side signal source inputs a cell side read signal of the predetermined value to the memory cell after the initialization signal is input. A comparison unit compares a reference signal output from the reference cell circuit into which the reference side read signal has been input, and a cell signal output from the memory cell into which the cell side read current has been input, and acquires the comparison result as read data.

20 Claims, 14 Drawing Sheets

(52) U.S. Cl.
CPC ........ *G11C 11/1675* (2013.01); *G11C 13/004* (2013.01); *G11C 2013/0054* (2013.01); *G11C 2211/5614* (2013.01); *G11C 2211/5615* (2013.01); *G11C 2213/54* (2013.01)

(58) Field of Classification Search
USPC .................................. 365/158, 209, 210.14
See application file for complete search history.

(56) References Cited

U.S. PATENT DOCUMENTS

| | | | | |
|---|---|---|---|---|
| 8,587,994 | B2 * | 11/2013 | Kim | G11C 11/16 365/158 |
| 8,780,609 | B2 * | 7/2014 | Mori | G11C 13/004 365/148 |
| 9,659,622 | B1 * | 5/2017 | Choy | G11C 11/1673 |
| 2009/0201717 | A1 | 8/2009 | Maeda et al. | |

\* cited by examiner

FIG. 4

| MAGNETIZATION STATE | ANTIPARALLEL STATE | PARALLEL STATE |
|---|---|---|
| LOGICAL VALUE | "1" | "0" |
| RESISTANCE VALUE | HIGH | LOW |
| CURRENT DIRECTION | PINNED MAGNETIC LAYER → FREE MAGNETIC LAYER | FREE MAGNETIC LAYER → PINNED MAGNETIC LAYER |

STORAGE DEVICE, INFORMATION PROCESSING APPARATUS, AND STORAGE DEVICE CONTROL METHOD

CROSS REFERENCE TO RELATED APPLICATIONS

This application is a national stage application under 35 U.S.C. 371 and claims the benefit of PCT Application No. PCT/JP2017/002120 having an international filing date of 23 Jan. 2017, which designated the United States, which PCT application claimed the benefit of Japanese Patent Application No. 2016-047986 filed 11 Mar. 2016, the entire disclosures of each of which are incorporated herein by reference.

TECHNICAL FIELD

The present technology relates to a storage device, an information processing apparatus, and a storage device control method. More specifically, the present technology relates to a storage device provided with a cell having a variable resistance value, an information processing apparatus, and a storage device control method.

BACKGROUND ART

Various types of storage devices are being used as cache memory and storage in information processing systems in recent years. Memory such as resistive RAM (ReRAM), phase-change RAM (PCRAM), and magnetoresistive RAM (MRAM) are being developed as next generation storage devices.

Among these types of memory, MRAM using a magnetic tunnel junction (MTJ) element is gaining attention for several reasons such as the fact that it is compact, fast, and the number of rewrites is close to infinite. With this MRAM, the resistance value is variable, so data can be rewritten by changing the resistance value. An inducted magnetic field writing method or a spin injection method is used to rewrite the MRAM. More specifically, in applications requiring miniaturization, the spin injection method is suitable because an increase in current can be suppressed. In this spin injection method, data is rewritten by supplying a write current that is larger than a certain reversal threshold, perpendicular to the surface of the MTJ element. The value of the data to be written is determined by the direction of the write current.

Also, when reading data, a read circuit supplies a read current that is smaller than a reversal threshold to a memory cell. Then, the read circuit compares a cell voltage of a memory cell to which the read current was supplied, and a predetermined reference voltage, and outputs the comparison result as a read data value. Non-volatile memory that generates this reference voltage in a plurality of reference cells having the same configuration as the memory cell has been proposed (refer to Patent Literature 1, for example). With this non-volatile memory, the combined resistance of the plurality of reference cells is initialized so as to become the average of the resistance values of each of the memory cells in a high resistance state and a low resistance state.

CITATION LIST

Patent Literature

Patent Literature 1: JP 2008-84517A

DISCLOSURE OF INVENTION

Technical Problem

However, in the conventional technology described above, the combined resistance of the reference cells may end up changing from the initial value. For example, if a phenomenon referred to as thermal disturbance, in which the magnetization direction of the MTJ element is reversed by thermal energy, occurs, the resistance values of the reference cells will end up changing. The reference voltage changes due to this change in the resistance values, and consequently a problem arises in which data that is different from the data that is actually written in the memory cell ends up being read. This problem tends to occur particularly when using MRAM for cache memory or the like where non-volatility is not regarded as important.

The present technology was created in view of such a situation, and aims to accurately read data in a storage device provided with a cell having a variable resistance Value.

Solution to Problem

The present technology has been devised to solve the above-described problem, and a first aspect thereof is a storage device and a control method thereof, the storage device including: a reference cell circuit in which a resistance value changes to a predetermined initial value when an initialization signal exceeding a predetermined reversal threshold is input; a reference side signal source that inputs a reference side read signal of a predetermined value not exceeding the predetermined reversal threshold to the reference cell circuit after the initialization signal is input to the reference cell circuit when there is an instruction to read with respect to a memory cell; a cell side signal source that inputs a cell side read signal of the predetermined value to the memory cell after the initialization signal is input; and a comparison unit that compares a reference signal output from the reference cell circuit into which the reference side read signal has been input, and a cell signal output from the memory cell into which the cell side read current has been input, and acquires the comparison result as read data. As a result, there is an effect in which the reference side read signal is input after the initialization signal is input to the reference cell circuit.

In addition, according to this first aspect, the reference cell circuit may include a plurality of reference cells. A combined resistance of the resistance values of each of the plurality of reference cells may change to the initial value with the initialization signal. As a result, there is an effect in which the combined resistance is initialized.

In addition, according to this first aspect, the reference cell circuit may include a plurality of first reference cells connected in parallel between the reference side read signal source and a connection point, and a plurality of second reference cells connected in parallel between the connection point and a ground terminal. The resistance values of each of the first reference cells and each of the second reference cells may be initialized to different values when the initialization signal is input. As a result, there is an effect in which the reference cell circuit, in which the plurality of first reference cells that are connected together in parallel are connected in series to the plurality of second reference cells that are connected together in parallel, is initialized.

In addition, according to this first aspect, the reference cell circuit may include a plurality of circuit blocks connected in parallel between the reference side signal source and a ground terminal. Each of the plurality of circuit blocks may include a first reference cell and a second reference cell connected in series. The resistance values of each of the first resistance cell and the second resistance cell may be initialized to different values when the initialization signal is input. As a result, there is an effect in which the reference cell circuit, in which the plurality of circuit blocks that include the first reference cells and the second reference cells connected together in series are connected together in parallel, is initialized.

In addition, according to this first aspect, a memory cell array in which a predetermined number of the memory cells are arranged in a two-dimensional lattice pattern may be further included. The reference side signal source may input the initialization signal each time there is an instruction to read with respect to the predetermined number of memory cells arranged in a predetermined direction. As a result, there is an effect in which the reference cell circuit is initialized every time there is a command to read with respect to a predetermined number of cells arranged in a predetermined direction.

In addition, according to this first aspect, the initialization signal, the reference side read signal, and the cell side read signal may be current signals, and the reference signal and the cell signal may be voltage signals. As a result, there is an effect in which initialization and reading are performed with a current signal.

In addition, according to this first aspect, the initialization signal, the reference side read signal, and the cell side read signal may be voltage signals, and the reference signal and the cell signal may be current signals. As a result, there is an effect in which initialization and reading are performed with a current signal.

In addition, according to this first aspect, the reference cell circuit and the memory cell may be MTJ elements. As a result, there is an effect in which the reference side read signal is input after the initialization signal is input to the MTJ element.

In addition, a second aspect of the present technology is an information processing apparatus including: a memory control unit that gives an instruction to read with respect to a memory cell; a reference cell circuit in which a resistance value changes to a predetermined initial value when an initialization signal exceeding a predetermined reversal threshold is input; a reference side signal source that inputs a reference side read signal of a predetermined value not exceeding the predetermined reversal threshold to the reference cell circuit after the initialization signal is input to the reference cell circuit when the instruction to read is given; a cell side signal source that inputs a cell side read signal of the predetermined value to the memory cell after the initialization signal is input; and a comparison unit that compares a reference signal output from the reference cell circuit into which the reference side read signal has been input, and a cell signal output from the memory cell into which the cell side read current has been input, and acquires the comparison result as read data. As a result, there is an effect in which the reference side read signal is input after the initialization signal has been input to the reference cell circuit when there is a command to read by the memory control unit.

Advantageous Effects of Invention

According to the present technology, an excellent effect in which data can be accurately read in a storage device provided with a cell having a variable resistance value, is able to be achieved.

Note that effects described herein are not necessarily limitative, and any effect that is desired to be described in the present disclosure may be admitted.

BRIEF DESCRIPTION OF DRAWINGS

FIG. 4 is view illustrating an example of a characteristic of a memory cell according to the first embodiment of the present technology.

MODE(S) FOR CARRYING OUT THE INVENTION

Hereinafter, modes for carrying out the present technology (hereinafter, referred to as embodiments) will be described. The description will be provided in the following order.

1. First embodiment (example of initializing a reference cell with current before reading)
2. Second embodiment (example of initializing a reference cell with voltage before reading)

1. First Embodiment

[Configuration Example of Information Processing Apparatus]

Figure 1:
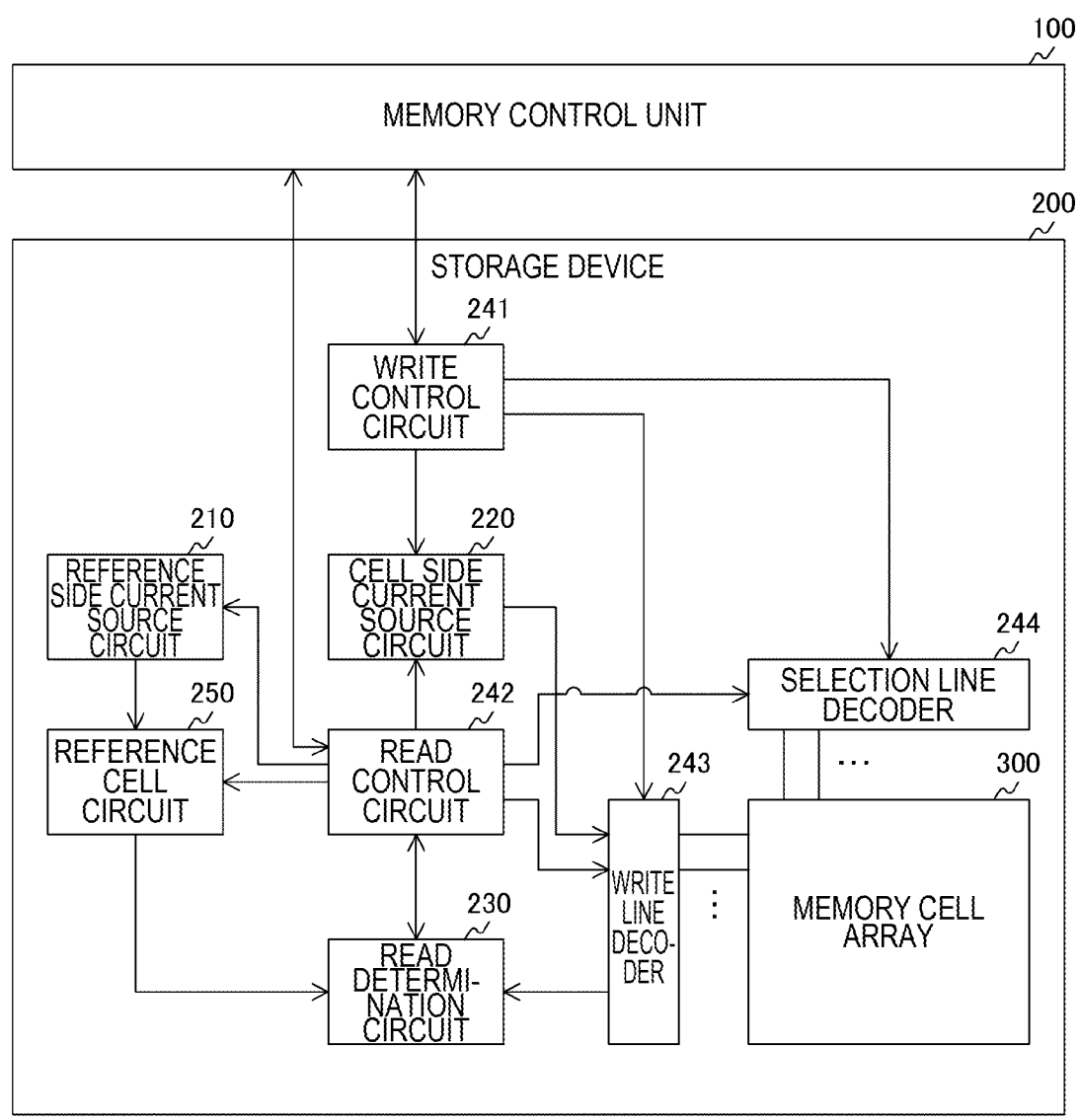
FIG. 1 is block diagram illustrating a configuration example of an information processing apparatus according to a first embodiment of the present technology.

FIG. 1 is block diagram illustrating a configuration example of an information processing apparatus according to a first embodiment of a first embodiment. The information processing apparatus includes a memory control unit 100 and a storage device 200. The storage device 200 is used as storage or cache memory in the information processing apparatus. The storage device 200 includes a reference side current source circuit 210, a cell side current source circuit 220, a read determination circuit 230, a write control circuit 241, a read control circuit 242, and a reference cell circuit 250. Also, the storage device 200 includes a write line decoder 243, a selection line decoder 244, and a memory cell array 300.

The memory control unit 100 controls the storage device 200. This memory control unit 100 supplies write data, and a write command specifying a write address, to the write control circuit 241 when writing data to the storage device 200. Also, the memory control unit 100 receives a status indicating the state of the storage device 200 from the write control circuit 241. Also, the memory control unit 100 supplies a read command specifying a read address to the read control circuit 242 when reading data from the storage device 200. Also, the memory control unit 100 receives the read data and the status from the read control circuit 242.

The write control circuit 241 performs control to write the write data to the write address in accordance with the write command. Upon receiving the write command, the write control circuit 241 controls the cell side current source circuit 220 to supply, as a write current $I_{write}$, a current larger than a reversal threshold Th. Here, the reversal threshold Th is the current value when the resistance value of the memory cell changes. Also, the direction of the write current $I_{write}$ is determined by the value of the write data.

Also, the write control circuit 241 separates the write address into a column address and a row address, and supplies a control signal indicative of the column address to the selection line decoder 244, and supplies a control signal indicative of the row address to the write line decoder 243. Also, the write control circuit 241 generates a status and supplies this status to the memory control unit 100.

The read control circuit 242 performs control to read the read data from the read address in accordance with the read command. Upon receiving the read command, the read control circuit 242 controls the reference side current source circuit 210 to supply, as an initialization current $I_{ini}$, a current larger than the reversal threshold Th. The resistance value of the reference cell circuit 250 is initialized to an initial value by this initialization current $I_{ini}$. For example, when the resistance of a memory cell in a low resistance state is $R_0$ and the resistance of the memory cell in a high resistance state is $R_1$, the resistance value of the reference cell circuit 250 will be initialized to $(R_0+R_1)/2$.

After the initialization of the reference cell circuit 250, the read control circuit 242 controls the reference side current source circuit 210 to supply, as a reference side read current $I_{read1}$, a current equal to or less than the reversal threshold Th. Also, when the reference side read current $I_{read1}$ is supplied, the read control circuit 242 controls the cell side current source circuit 220 to supply, as a cell side read current $I_{read2}$, a current of the same value as the reference side read current $I_{read1}$.

Also, the read control circuit 242 separates the read address into a column address and a row address, and supplies a control signal indicative of the column address to the selection line decoder 244, and supplies a control signal indicative of the row address to the write line decoder 243. Then, the read control circuit 242 controls the read determination circuit 230 to output read data, and supplies the status and the read data to the memory control unit 100.

The reference side current source circuit 210 inputs the initialization current $I_{ini}$ and the reference side read current $I_{read1}$ in this order to the reference cell circuit 250 in accordance with the control of the read control circuit 242. Note that the reference side current source circuit 210 is one example of a reference side read signal source described in the claims.

The reference cell circuit 250 is a circuit in which the resistance value changes when an initialization signal is input. The resistance value of the reference cell circuit 250 is initialized to $(R_0+R_1)/2$ when the initialization signal is input. Also, when the reference side read current $I_{read1}$ is input, the reference cell circuit 250 outputs a reference voltage $V_{ref}$ represented by the following expression to the read determination circuit 230.

$$V_{ref}=I_{read1}\times(R_0+R_1)/2$$

The cell side current source circuit 220 inputs the write current $I_{write}$ or the cell side read current $I_{read2}$ to the write line decoder 243 in accordance with the control of the write control circuit 241 or the read control circuit 242.

A plurality of memory cells are arranged in a two-dimensional lattice pattern in the memory cell array 300. Hereinafter, an assembly of memory cells arranged along any one of two orthogonal directions will be referred to as a "line." The assembly of memory cells arranged in one of the two directions in a line will be referred to as a "row," and the assembly of memory cells arranged in the other will be referred to as a "column."

The selection line decoder 244 selects the column to be accessed, in accordance with the control of the write control circuit 241 and the read control circuit 242.

The write line decoder 243 supplies the currents (the write current $I_{write}$ and the cell side read current $I_{read2}$) from the cell side current source circuit 220 to the row to be accessed, in accordance with the control of the write control circuit 241 and the read control circuit 242. The resistance value of the memory cell to which the write current $I_{write}$ has been input changes to one of a low resistance $R_0$ and a high resistance $R_1$. Also, the memory cell to which the cell side read current $I_{read2}$ has been input generates a voltage corresponding to that resistance value as a cell voltage $V_{cell}$, and outputs this cell voltage $V_{cell}$ to the read determination circuit 230 via the write line decoder 243. When the resistance value of the memory cell is the low resistance $R_0$, the cell voltage $V_{cell}$ of $I_{read2} \times R_0$ is generated, and when the low resistance value of the memory cell is the high resistance $R_1$, the cell voltage $V_{cell}$ of $I_{read2} \times R_1$ is generated.

The read determination circuit 230 compares the reference voltage $V_{ref}$ from the reference cell circuit 250 and the cell voltage $V_{cell}$ from the memory cell. The read determination circuit 230 acquires the comparison result as read data and supplies this read data to the read control circuit 242. Note that the read determination circuit 230 is one example of a comparison unit described in the claims.

[Configuration Example of Memory Cell Array]

Figure 2:
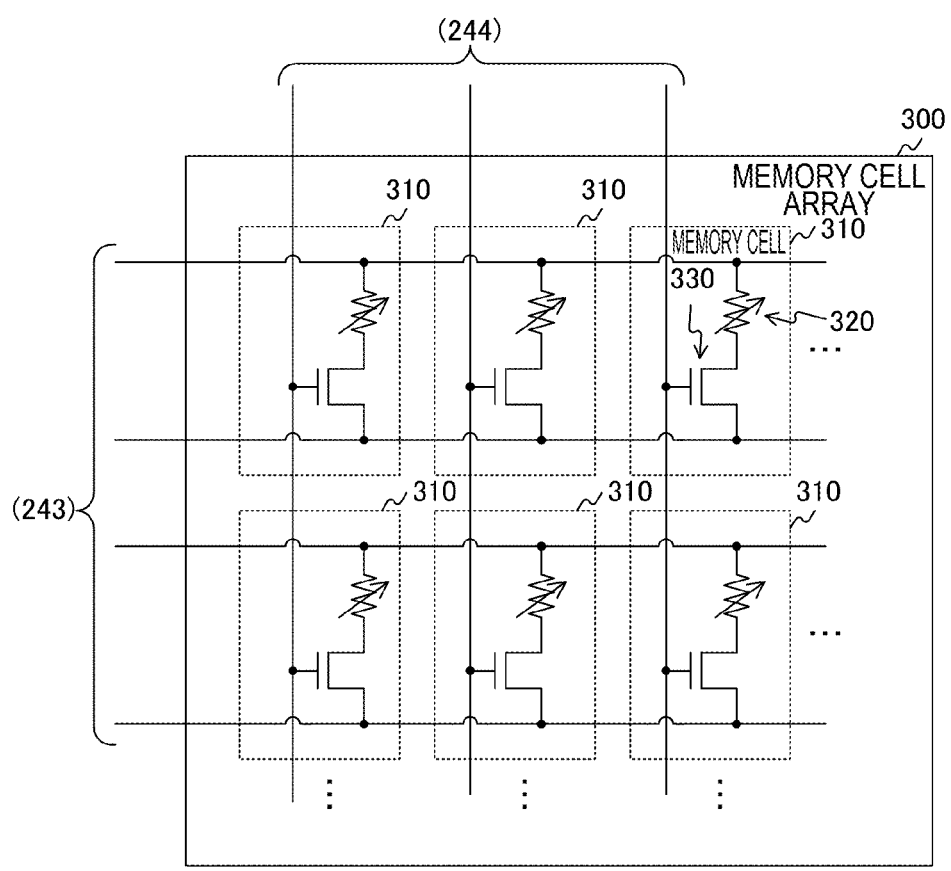
FIG. 2 is a circuit diagram illustrating a configuration example of a memory cell array according to the first embodiment of the present technology.

FIG. 2 is a circuit diagram illustrating a configuration example of the memory cell array 300 according to the first embodiment. The memory cell array 300 includes a plurality of memory cells 310 arranged in a two-dimensional lattice pattern. Each of the memory cells 310 has an MTJ element 320 and a transistor 330. Also, a selection line is wired for each column, and a pair of write lines are wired for each row, in the memory cell array 300.

One end of the MTJ element 320 is connected to the write line decoder 243 via the write line, and the other end is connected to the transistor 330. Also, a gate of the transistor 330 is connected to the selection line decoder 244 via a selection line, and one of a source and a drain is connected to the MTJ element 320, and the other is connected to the write line decoder 243 via the write line. An N-type metal-oxide-semiconductor (MOS) transistor, for example, is used as the transistor 330.

When writing, the selection line decoder 244 sets the selection line corresponding to the column to be written to a high level, and sets all of the other selection lines to a low level. Also, the write line decoder 243 supplies the write current $I_{write}$ from one of the pair of write lines that correspond to the row to be written to the other via the write line. The direction of the write current $I_{write}$ is determined by the value of the write data. According to these kinds of control, the resistance value of the memory cell 310 that corresponds to the write address changes to either the low resistance $R_0$ or the high resistance $R_1$, whichever corresponds to the write data. That is, the write data is written.

On the other hand, when reading, the selection line decoder 244 sets the selection line corresponding to the column to be read to a high level, and sets all of the other selection lines to a low level. Also, the write line decoder 243 supplies the cell side read current $I_{read2}$ from one of the pair of write lines that correspond to the row to be read to the other via the write line. According to these kinds of control, the cell voltage $V_{cell}$ corresponding to the resistance value of the memory cell to be read is generated between the pair of write lines corresponding to the row address.

[Configuration Example of MTJ Element]

Figure 3:
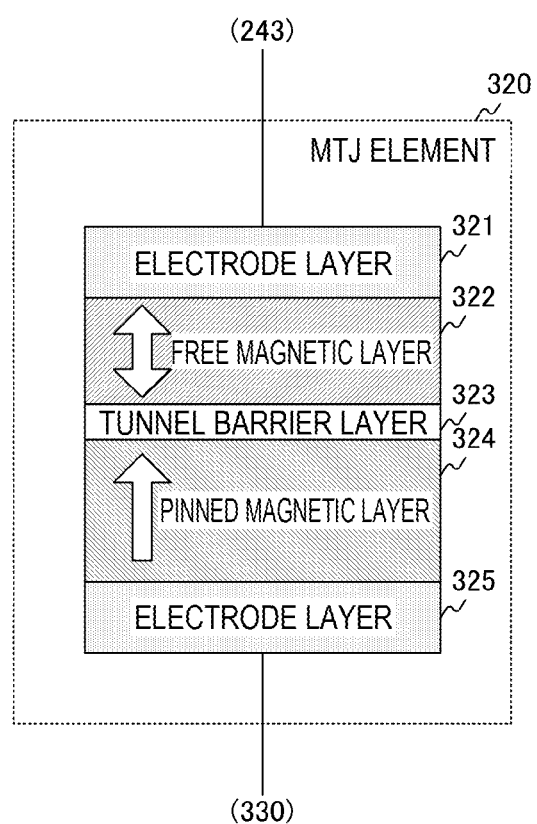
FIG. 3 is a sectional view illustrating a configuration example of an MTJ element according to the first embodiment of the present technology.

FIG. 3 is a sectional view illustrating a configuration example of the MTJ element 320 according to the first embodiment. In the MTJ element 320, an electrode layer 325, a pinned magnetic layer 324, a tunnel barrier layer 323, a free magnetic layer 322, and an electrode layer 321 are stacked in this order on a substrate on which the transistor 330 is formed. The electrode layer 321 is connected to the write line decoder 243 via a write signal line, and the electrode layer 325 is connected to the transistor 330. The element that includes the free magnetic layer 322, the tunnel barrier layer 323, and the pinned magnetic layer 324 is also referred to as a tunnel magneto resistance (TMR) element.

Note that the stacking order is not limited to the order of the electrode layer 325, the pinned magnetic layer 324, the tunnel barrier layer 323, the free magnetic layer 322, and the electrode layer 321, and may be in the reverse order.

The free magnetic layer 322 is a ferromagnetic layer in which the direction of magnetization changes, and the pinned magnetic layer 324 is a ferromagnetic layer in which the direction of magnetization is fixed. The fixation of the magnetization of the pinned magnetic layer 324 can be realized by using material with a large coercive force, for example, as the pinned magnetic layer 324. Note that the magnetization of the pinned magnetic layer 324 can also be fixed by setting an antiferromagnetic layer adjacent to the pinned magnetic layer 324.

The direction of the magnetization of the free magnetic layer 322 changes along the axis of easy magnetization to the same direction as, or the opposite direction to, the direction of magnetization of the pinned magnetic layer 324. A state in which the free magnetic layer 322 is magnetized in the same direction as the pinned magnetic layer 324 will hereinafter be referred to as a "parallel state," and a state in which the free magnetic layer 322 is magnetized in the opposite direction to the pinned magnetic layer 324 will hereinafter be referred to as an "antiparallel state." Also, the magnetic anisotropy of the free magnetic layer 322 is determined by one or a combination of crystal magnetic anisotropy depending on the material, strain induced anisotropy, and shape magnetic anisotropy depending on the planar shape.

Also, the direction of the magnetic anisotropy of the free magnetic layer 322 and the direction of magnetization of the pinned magnetic layer 324 are perpendicular to each layer. Note that these directions may be parallel to each layer.

Note that the free magnetic layer 322 and the pinned magnetic layer 324 are single layers, but they may be laminated magnetic films that are ferromagnetically or antiferromagnetically connected via, a nonmagnetic metal.

Also, a metal such as aluminum (Al), copper (Cu), or tantalum (Ta) is used as the material of the electrode layers 321 and 325. A ferromagnetic film or a laminated magnetic film is used as the free magnetic layer 322 and the pinned magnetic layer 324. Cobalt iron boron (CoFeB), cobalt iron (CoFe), nickel iron (NiFe), or nickel iron cobalt (NiFeCo) or the like is used as the ferromagnetic film. Also, cobalt (Co)/platinum (Pt), or cobalt (Co)/nickel (Ni) or the like is used as the laminated magnetic film. An aluminum oxide film or an insulating film of magnesium oxide (MgO) or the like is used as the tunnel barrier layer 323.

Data is written to the MTJ element 320 by the spin injection method. With the spin injection method, a direct current is input to the MTJ element, and consequently the free magnetic layer 322 reverses. The magnetization direction of the free magnetic layer is determined by the direction in which the current flows. In a case where current flows from the free magnetic layer 322 to the pinned magnetic layer 324, electrons flow from the pinned magnetic layer 324 to the free magnetic layer 322. In this case, the electrons that pass through the pinned magnetic layer 324 come to spin in the same direction as the magnetization direction of the pinned magnetic layer 324 due to the interaction with the magnetization of the pinned magnetic layer 324. These spin-polarized conduction electrons interact with the magnetization of the free magnetic layer 322 when passing through the free magnetic layer 322, such that torque is generated in the magnetization of the free magnetic layer 322. When this torque is sufficiently large, the magnetization of the free magnetic layer 322 reverses. The current necessary for this reversal corresponds to the reversal threshold Th described above.

On the other hand, in a case where current flows from the pinned magnetic layer 324 to the free magnetic layer 322, electrons flow from the free magnetic layer 322 to the pinned magnetic layer 324. In this case, electrons that spin in the opposite direction to the direction of the magnetization of the pinned magnetic layer 324 are reflected by the pinned magnetic layer 324. Therefore, the magnetization of the free magnetic layer 322 reverses by the electrons that spin in the opposite direction.

With such a spin injection method, the reversal threshold Th depends on the current density. Therefore, the reversal threshold Th decreases with the miniaturization of the memory cells. Thus, the spin injection method is advantageous for increasing the capacity of the MRAM.

FIG. 4 is view illustrating an example of a characteristic of the memory cell 310 according to the first embodiment. The magnetization state of the MTJ element 320 in the memory cell 310 can be divided into a parallel state in which the directions of magnetization of the free magnetic layer 322 and the pinned magnetic layer 324 are the same, and an antiparallel state in which these directions are different. A different logical value is assigned to each of these states. For example, a logical value of "1" is assigned to the antiparallel state, and a logical value of "0" is assigned to the parallel state.

The resistance value of the MTJ element 320 in the antiparallel state is higher than it is in the parallel state. For example, the resistance change ratio of the parallel state and the antiparallel state will be several ten to several hundred percent (%). Also, the logical value of the MTJ element 320 can be rewritten by changing the direction of the current to the MTJ element 320. For example, in a case where rewriting the logical value to "1" (antiparallel state), current is supplied in the direction from the pinned magnetic layer 324 to the free magnetic layer 322. On the other hand, in a case where rewriting the logical value to "0" (parallel state), current is supplied in the direction from the free magnetic layer 322 to the pinned magnetic layer 324.

[Configuration Example of Reference Cell Circuit]

Figure 5:
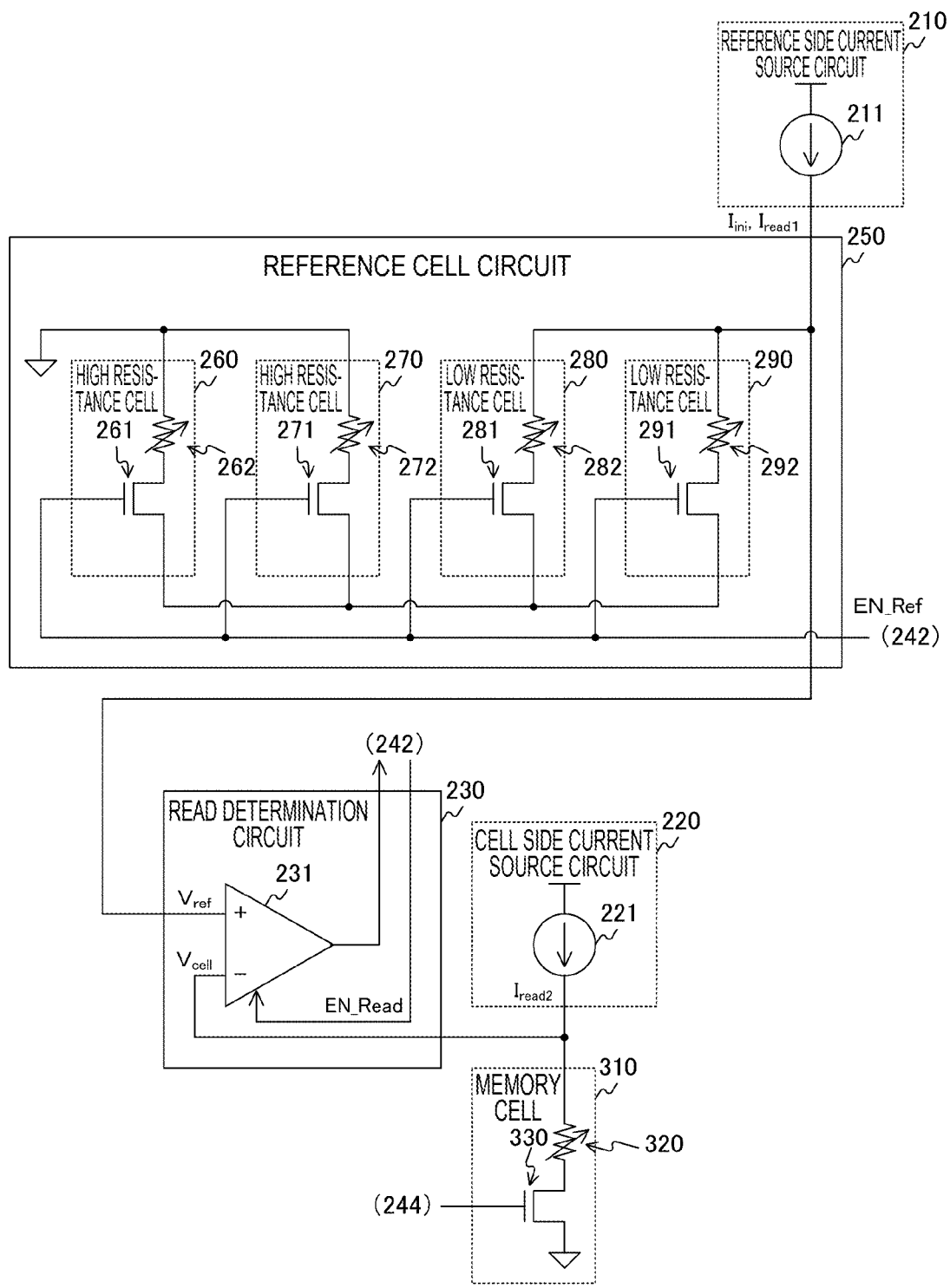
FIG. 5 is a circuit diagram illustrating a configuration example of a reference cell circuit, a read determination circuit, a reference side current source circuit, and a cell side current source circuit according to the first embodiment of the present technology.

FIG. 5 is a circuit diagram illustrating a configuration example of the reference cell circuit 250, the read determination circuit 230, the reference side current source circuit 210, and the cell side current source circuit 220 according to the first embodiment. The reference cell circuit 250 includes, as reference cells, high resistance cells 260 and 270 and low resistance cells 280 and 290. The high resistance cell 260 includes a transistor 261 and an MU element 262, and the high resistance cell 270 includes a transistor 271 and an MTJ element 272. Also, the low resistance cell 280 includes a transistor 281 and an MTJ element 282, and the low resistance cell 290 includes a transistor 291 and an MU element 292. The MU elements 262, 272, 282, and 292 are manufactured by a process similar to that of the MTJ element 320 of the memory cell.

By aligning the processes of the reference cell and the memory cell in this way, data can be read accurately even if there are process variations in the characteristics of the MTJ elements.

Also, the reference side current source circuit 210 includes a reference side current source 211, and the cell side current source circuit 220 includes a cell side current source 221. The read determination circuit 230 includes a sense amplifier 231.

N-type MOS transistors, for example, are used as the transistors 261, 271, 281, and 291. Gates of these transistors 261, 271, 281, and 291 are connected to the read control circuit 242. Also, terminals on the MTJ element side of the low resistance cells 280 and 290 are connected in parallel to the reference side current source 211. Terminals on the transistor side of the low resistance cells 280 and 290 are commonly connected to terminals on the transistor side of the high resistance cells 260 and 270. Also, terminals on the MTJ element side of the high resistance cells 260 and 270 are commonly connected to a ground terminal.

The read control circuit 242 controls the transistors 261, 272, 281, and 291 to an ON state by an enable signal EN_Ref during a period when current is caused to be supplied to the reference side current source 211, and controls the transistors 261, 272, 281, and 291 to an OFF state at other periods.

Also, the initialization current $I_{ini}$ from the reference side current source 211 flows in different directions in the high resistance cells 260 and 270 than in the low resistance cells 280 and 290. As a result of this initialization current $I_{ini}$, the high resistance cells 260 and 270 are initialized to the high resistance $R_1$, and the low resistance cells 280 and 290 are initialized to the low resistance $R_0$.

The high resistance cells 260 and 270 are connected in parallel, so the combined resistance of these is $R_1/2$. The low resistance cells 280 and 290 are also connected in parallel, so the combined resistance of these is $R_0/2$. Also, the circuit that includes the high resistance cells 260 and 270 is connected in series to the circuit that includes the low resistance cells 280 and 290, so the combined resistance of the entire reference cell circuit 250 becomes $(R_0+R_1)/2$ as a result of the initialization. The reference voltage $V_{ref}$ corresponding to this resistance is output from the reference cell circuit 250 to a non-reversing input terminal (+) of the sense amplifier 231.

On the other hand, when the reference side read current $I_{read1}$ is supplied, the cell side current source 221 supplies the cell side read current $I_{read2}$ of the same value as the $I_{read1}$, to the memory cell 310. As described above, the resistance value of the memory cell 310 is one of the high resistance $R_0$ and the low resistance $R_1$. The cell voltage $V_{cell}$ corresponding to this resistance is output from the reference cell circuit 250 to a reversing input terminal (−) of the sense amplifier 231.

The sense amplifier 231 compares the reference voltage $V_{ref}$ with the cell voltage $V_{cell}$. The sense amplifier 231 compares the voltages when an enable signal EN_Read from the read control circuit 242 is set to enabled. Then, the sense amplifier 231 supplies the comparison result as read data from the memory cell 310 to the read control circuit 242.

Note that the connection of each cell in the reference cell circuit 250 is not limited to the configuration described above as long as the combined resistance becomes an intermediate value between $R_0$ and $R_1$. For example, three or more high resistance cells may be connected in parallel to the reference side current source 211. Also, three or more low resistance cells may be connected in parallel to the high resistance cells.

Note that the low resistance cells 280 and 290 are examples of a first reference cell described in the claims. Also, the high resistance cells 260 and 270 are examples of a second reference cell described in the claims.

Figure 6:
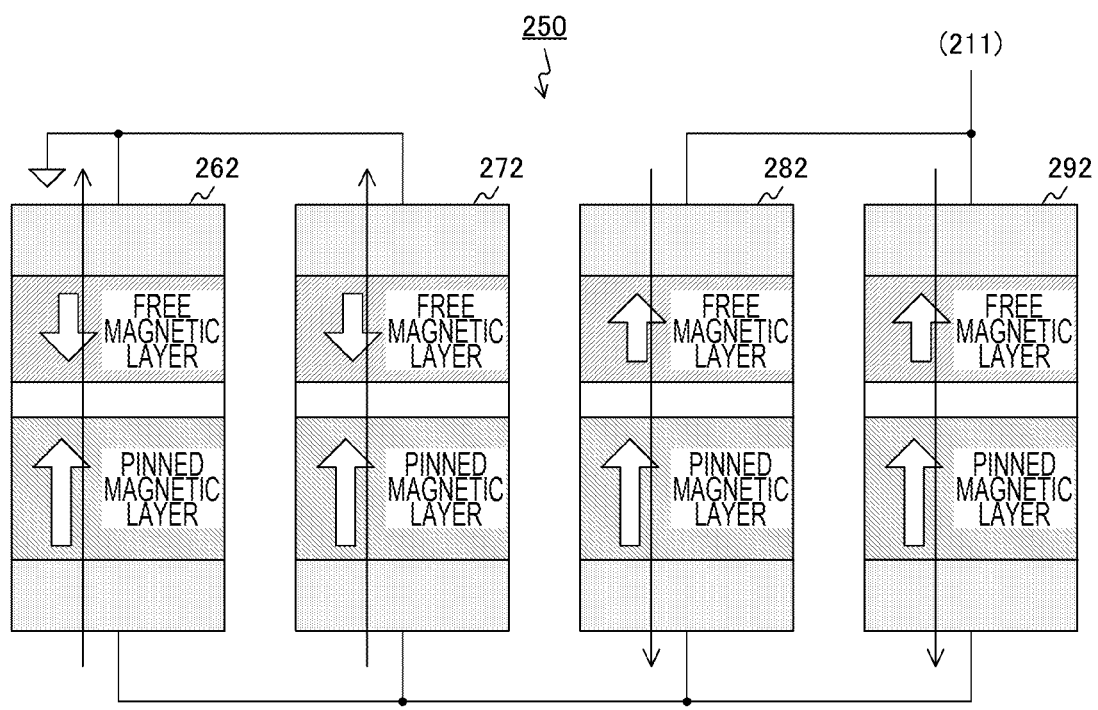
FIG. 6 is a circuit diagram illustrating a configuration example of a reference cell circuit according to the first embodiment of the present technology.

FIG. 6 is a circuit diagram illustrating a configuration example of the reference cell circuit 250 according to the first embodiment. In FIG. 6, the transistors 261, 271, 281, and 291 are omitted.

The initialization current $I_{ini}$ flows in the direction from the pinned magnetic layer to the free magnetic layer in the MTJ elements 262 and 272 of the high resistance cells 260 and 270, such that these cells are initialized to the high resistance $R_1$. On the other hand, the initialization current $I_{ini}$ flows in the direction from the free magnetic layer to the pinned magnetic layer in the MTJ elements 282 and 292 of the low resistance cells 280 and 290, such that these cells are initialized to the low resistance $R_0$. Also, the reference side read current $I_{read1}$ also flows in the same direction as the initialization current $I_{ini}$. Therefore, even if the reference side read current exceeds the reversal threshold for some reason, the reference cells (such as the high resistance cell 260) will not be mistakenly rewritten.

Figure 7:
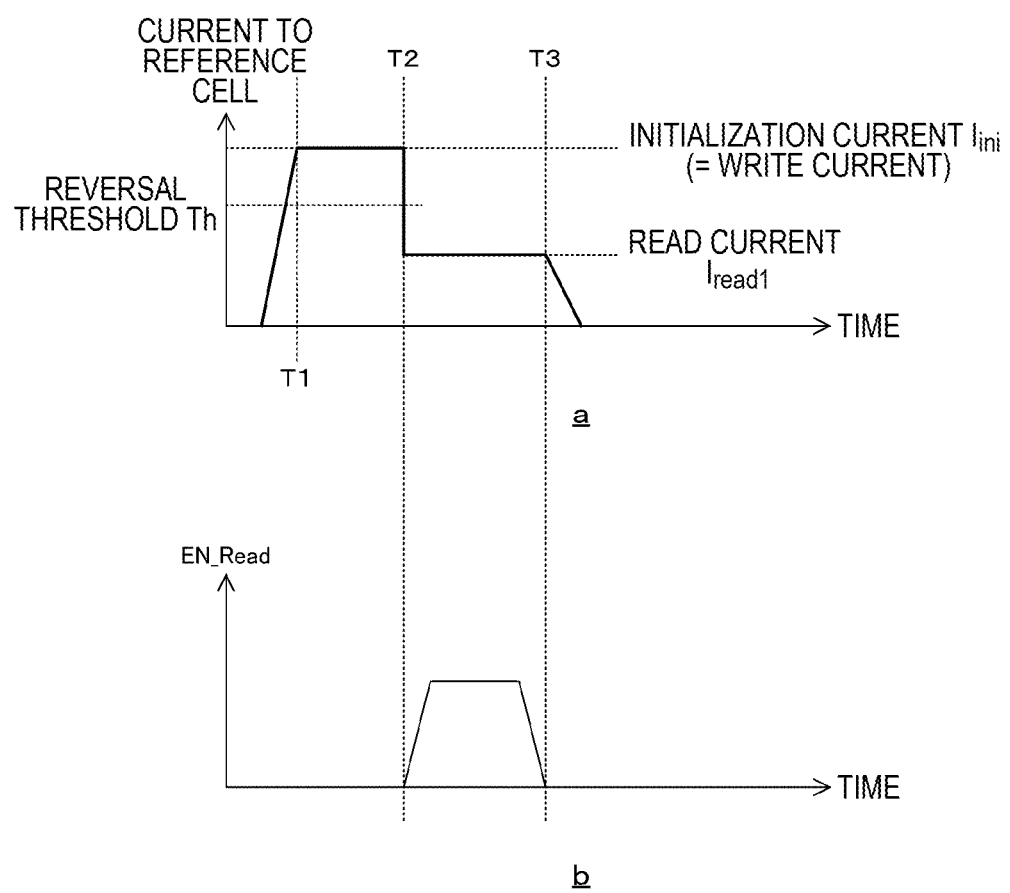
FIG. 7 is view illustrating an example of control of a reference cell and a read determination circuit according to the first embodiment of the present technology.

FIG. 7 is view illustrating an example of control of the reference cell circuit 250 and the read determination circuit 230 according to the first embodiment. Reference character a in FIG. 7 is a timing chart illustrating an example of fluctuation of the current to the reference cell. Reference character b in FIG. 7 is a view illustrating an example of fluctuation of the enable signal EN_Read to the read determination circuit 230. The vertical axis in a in FIG. 7 represents the level of current, and the horizontal axis represents time. The vertical axis in b in FIG. 7 represents the level of the enable signal EN_Read, and the horizontal axis represents time.

When a read command is input, the read control circuit 242 controls the reference side current source circuit 210 to start supplying the initialization current $I_{ini}$ at time T1. The level of this initialization current $I_{ini}$ is larger than the reversal threshold Th, similar to the write current $I_{write}$.

Also, at time T2 when a certain period of time has passed after time T1, the read control circuit 242 controls the reference side current source circuit 210 to reduce the level of the current to less than or equal to the reversal threshold Th. Accordingly, the supply of a reference side read current $I_{read2}$ starts.

Also, when time T2 passes, the read control circuit 242 enables the enable signal EN_Read (e.g., sets the enable signal EN_Read to a high level). When reading is finished, the read control circuit 242 disables the enable signal EN_Read (e.g., sets the enable signal EN_Read to a low level), and at time T3, controls the reference side current source circuit 210 to stop supplying current. In this way, the read determination circuit 230 is able to stably read the read data by supplying the enable signal EN_Read to the read determination circuit 230 in accordance with the timing at which the read currents ($I_{read1}$ and $I_{read2}$) are supplied.

Figure 8:
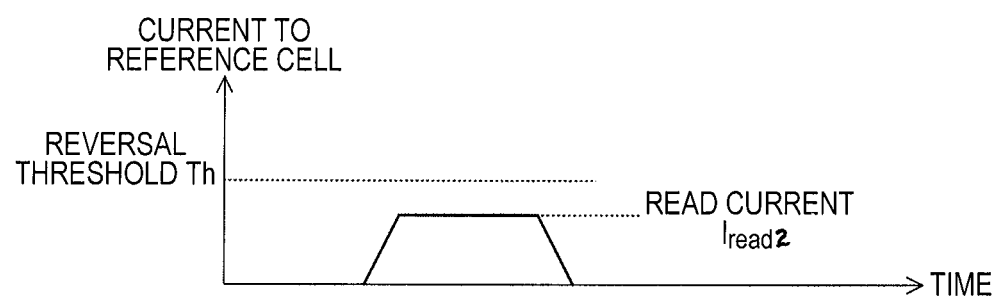
FIG. 8 is a view illustrating an example of control of a reference cell according to a comparative example.

FIG. 8 is a view illustrating an example of control of a reference cell according to a comparative example. In this comparative example, when the read command is input, the read control circuit is caused to supply the reference side read current $I_{read2}$, but not supply the initialization current $I_{ini}$.

In a configuration in which the initialization current $I_{ini}$ is not supplied in this way, the reference voltage changes when the resistance value of the reference cell changes to a value different from the initial value due to thermal disturbance or the like, and consequently, data that is different from the data that is actually written in the memory cell ends up being read.

In contrast, the reference side current source circuit 210 supplies the initialization current $I_{ini}$ right before supplying the reference side read current $I_{read2}$, when the read command is input. As a result, even if the resistance value of the reference cell has changed to a value that is different from the initial value, the resistance value of the reference cell can be reinitialized before the data is read. Therefore, the storage device 200 is able to accurately read the read data.

Here, thermal disturbance resistance is generally evaluated by a thermal disturbance index $\Delta E/(k_B J)$, for example. $\Delta E$ is an energy barrier between a parallel state and an antiparallel state of a cell, and the unit is joules (J), for example. $k_B$ is a Boltzmann coefficient, and the unit is joule per kelvin ($JK^{-1}$), for example. Also, T is the absolute temperature, and the unit is kelvin (K), for example.

In a case where the storage device 200 is used as storage, high thermal disturbance resistance is required because importance is placed on non-volatility. For example, the thermal disturbance index must be 60 or higher. In contrast, in a case where the storage device 200 of MRAM is used as cache by utilizing the characteristics of high speed and infinite number of rewrites, non-volatility is not important, so a thermal disturbance index of approximately 30, for example, is sufficient. Because the energy barrier $\Delta E$ is proportional to the volume, in a case where the storage device 200 is used as cache, it means that the MTJ element can be reduced in area and thus easily miniaturized.

However, in a case Where non-volatility (thermal disturbance resistance and the like) has been reduced in a storage device using an MTJ element in a reference cell as well, it is highly likely that the reference cell will reverse due to thermal disturbance. In order to suppress this thermal disturbance, the volume of the MTJ element need only be increased, but this makes miniaturization difficult. Also, a method in which a permanent magnet is arranged directly below the MTJ element to prevent this reversal is also conceivable, but there is the disadvantage that the manufacturing process becomes complicated.

Therefore, when using the storage device 200 for cache memory or the like where non-volatility is not required, in particular, a countermeasure against reversal of the reference cell becomes important. Thus, the effect is particularly large in a case where a configuration that initializes the reference cell right before reading is applied to cache memory.

Figure 9:
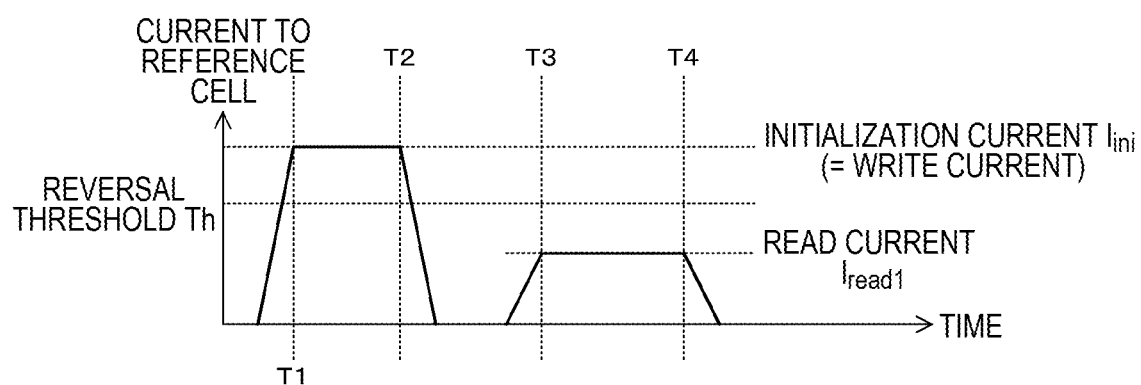
FIG. 9 is a view illustrating an example of control in which an initialization current and a reference side read current are separated, according to the first embodiment of the present technology.

Note that in FIG. 7, the reference side read current $I_{read1}$ is supplied right after the initialization current $I_{ini}$. That is, a current pulse of the initialization current $I_{ini}$ and a current pulse of the reference side read current $I_{read1}$ were not separated. However, these current pulses may be separated as illustrated in FIG. 9.

Also, the MU element is used as the memory cell and the reference cell, but an element (such as a resistance change element in ReRAM) of the MTJ element may be used as the memory cell and the like as long as long as it is memory in which the resistance value of the cell changes with the input of an electric signal. The resistance value of the resistance change element of ReRAM changes according to the voltage, so in a case where this resistance change element is used as the memory cell and the reference cell, an initialization voltage need simply be supplied instead of the initialization current.

Figure 10:
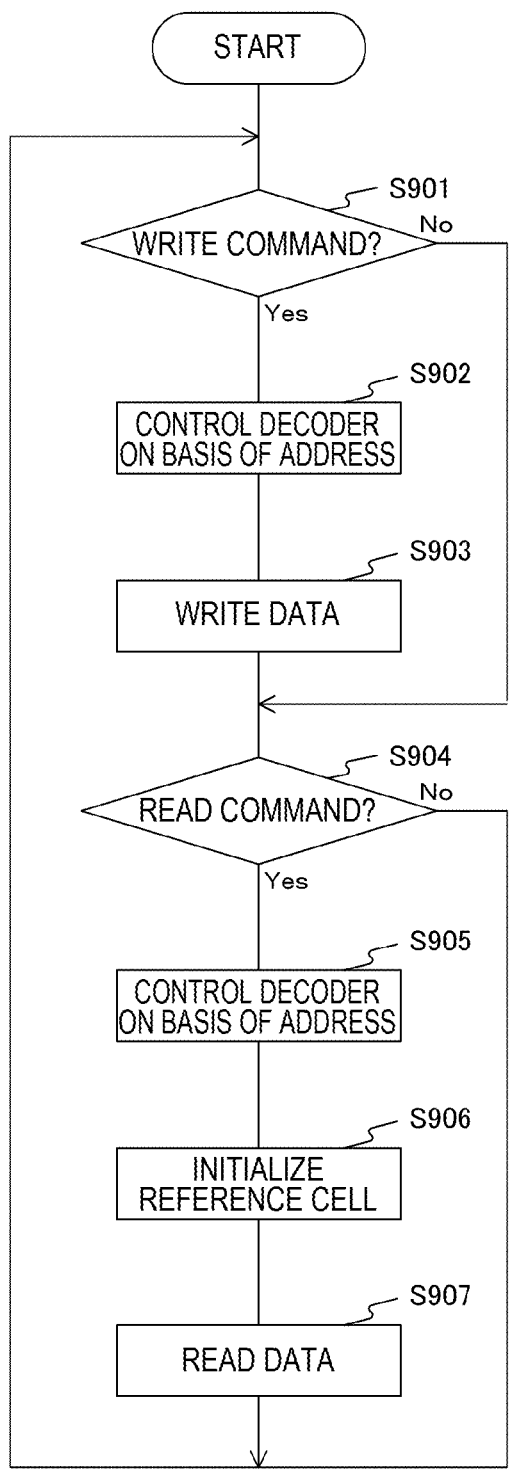
FIG. 10 is flowchart illustrating an example of operation of a storage device according to the first embodiment of the present technology.

FIG. 10 is flowchart illustrating an example of operation of the storage device 200 according to the first embodiment. This operation starts when the memory control unit 100 issues a command, for example. The storage device 100 determines whether the command is a write command (step S901). In a case where the command is a write command (step S900: Yes), the write control circuit 241 controls the write line decoder 243 and the selection line decoder 244 on the basis of the write address (step S902). Also, the write control circuit 241 writes the write data with the write current $I_{write}$ (step S903).

In a case where the command is not a write command (step S901: No), or after step S903, the write control circuit 241 determines whether the command is a read command (step S904). In a case where the command is a read command (step S904: Yes), the read control circuit 242 controls the write line decoder 243 and the selection line decoder 244 on the basis of the read address (step S905). Also, the read control circuit 241 initializes the reference cell with the initialization current $I_{ini}$ (step S906). Then, the read control circuit 241 reads the data from the memory cell with the read currents ($I_{read1}$ and $I_{read2}$) (step S907). In a case where the command is not a read command (step S904: No), or after step S907, the storage device 200 repeatedly executes steps S901 onward.

In this way, according to the first embodiment of the present technology, the reference side current source circuit 210 supplies the reference side read current to the reference cell after inputting the initialization current, so the reference cell can be initialized right before reading. As a result, the storage device 200 is able to accurately read the read data even if the resistance value of the reference cell has changed to a value that is different from the initial value before reading.

First Modified Example

In the first embodiment described above, the high resistance cells 260 and 270 that are connected in parallel, and the low resistance cells 280 and 290 that are connected in parallel, are connected in series, but the configuration is not limited to this as long as the combined resistance is an intermediate value between $R_0$ and $R_1$. For example, the high resistance cell 260 and the low resistance cell 280 that are connected in series, and the high resistance cell 270 and the low resistance cell 290 that are connected in series, may be connected in parallel. The reference cell circuit 250 of the first modified example of the first embodiment differs from the first embodiment in that the high resistance cell 260 and the low resistance cell 280 that are connected in series, and the high resistance cell 270 and the low resistance cell 290 that are connected in series, are connected in parallel.

Figure 11:
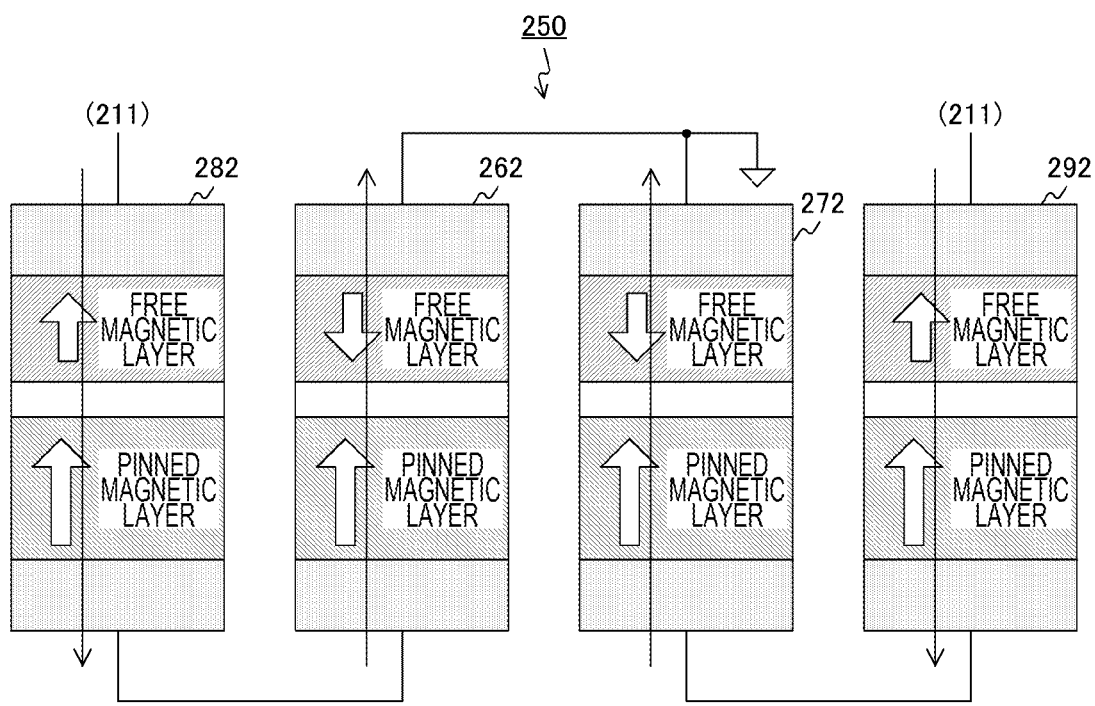
FIG. 11 is a circuit diagram illustrating a configuration example of a reference cell circuit according to a first modified example of the first embodiment of the present technology.

FIG. 11 is a circuit diagram illustrating a configuration example of the reference cell circuit 250 according to the first modified example of the first embodiment. In FIG. 11, the transistors 261, 271, 281, and 291 are omitted. In the first modified example of the first embodiment, the high resistance cell 260 and the low resistance cell 280 are connected in series. Also, the high resistance cell 270 and the low resistance cell 290 are also connected in series. Also, the high resistance cell 260 and the low resistance cell 280 that are connected in series, and the high resistance cell 270 and the low resistance cell 290 that are connected in series, are connected in parallel between the reference side current source 211 and the ground terminal. Because of this connection, the combined resistance of the reference cell circuit 250 becomes $(R_0+R_1)/2$ due to initialization.

Note that two pairs of one high resistance cell and one low resistance cell that are connected in series are connected in parallel, but three or more pairs of one high resistance cell and one low resistance cell may also be arranged and connected in parallel.

In this way, according to the first modified example of the first embodiment of the present technology, a plurality of circuits each of which includes a high resistance cell and a low resistance cell connected in series are connected in parallel, so the combined resistance is able to be the average of the resistance values of each of the high resistance cells and the low resistance cells.

Second Modified Example

In the first embodiment described above, every time there is an instruction to read a bit, the reference cell is initialized right before that reading, but as the number of bits to be read increases, the access time until reading is complete may become longer. The storage device 200 of a second modified example of the first embodiment differs from the first embodiment in that the access time is shortened.

Figure 12:
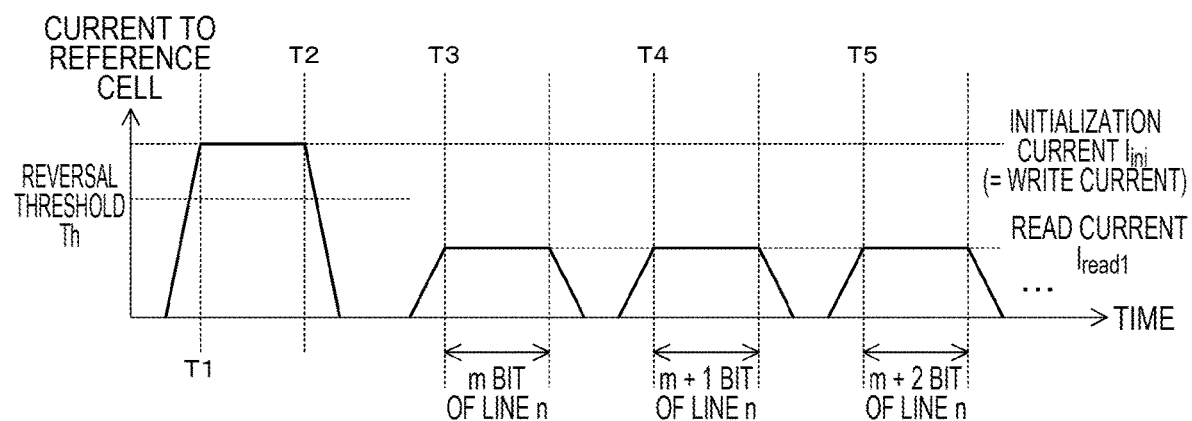
FIG. 12 is view illustrating an example of control of a reference cell according to a second modified example of the first embodiment of the present technology.

FIG. 12 is view illustrating an example of control of a reference cell and a decoder according to the second modified example of the first embodiment. The vertical axis in a in FIG. 12 represents the level of current to the reference cell, and the horizontal axis represents time.

The memory control unit 100 issues a read command that specifies the address of N (e.g., 16) continuous memory cells in a line (column or row). When a read command is input, the read control circuit 242 is caused to supply the initialization current $I_{ini}$, and continuously supplies the reference side read signal $I_{read1}$ for the N bits. That is, each time N consecutive memory cells in a line are read, the reference cell is initialized right before that reading.

In this way, according to the second modified example of the first embodiment of the present technology, the storage device 200 initializes the reference cell each time N consecutive cells (N bits) are read, so the access time can be shorter than it is in a case where the reference cell is initialized each time a bit is read.

2. Second Embodiment

In the first embodiment described above, the storage device 200 inputs a constant current ($I_{read1}$) to the reference cell and generates a reference voltage corresponding to the resistance value, but instead of this, the storage device 200 may input a constant voltage to the reference cell and generate a reference current corresponding to the resistance value. The storage device 200 of a second embodiment differs from the first embodiment in that the storage device 200 inputs a constant voltage to the reference cell and generates a reference current corresponding to the resistance value.

Figure 13:
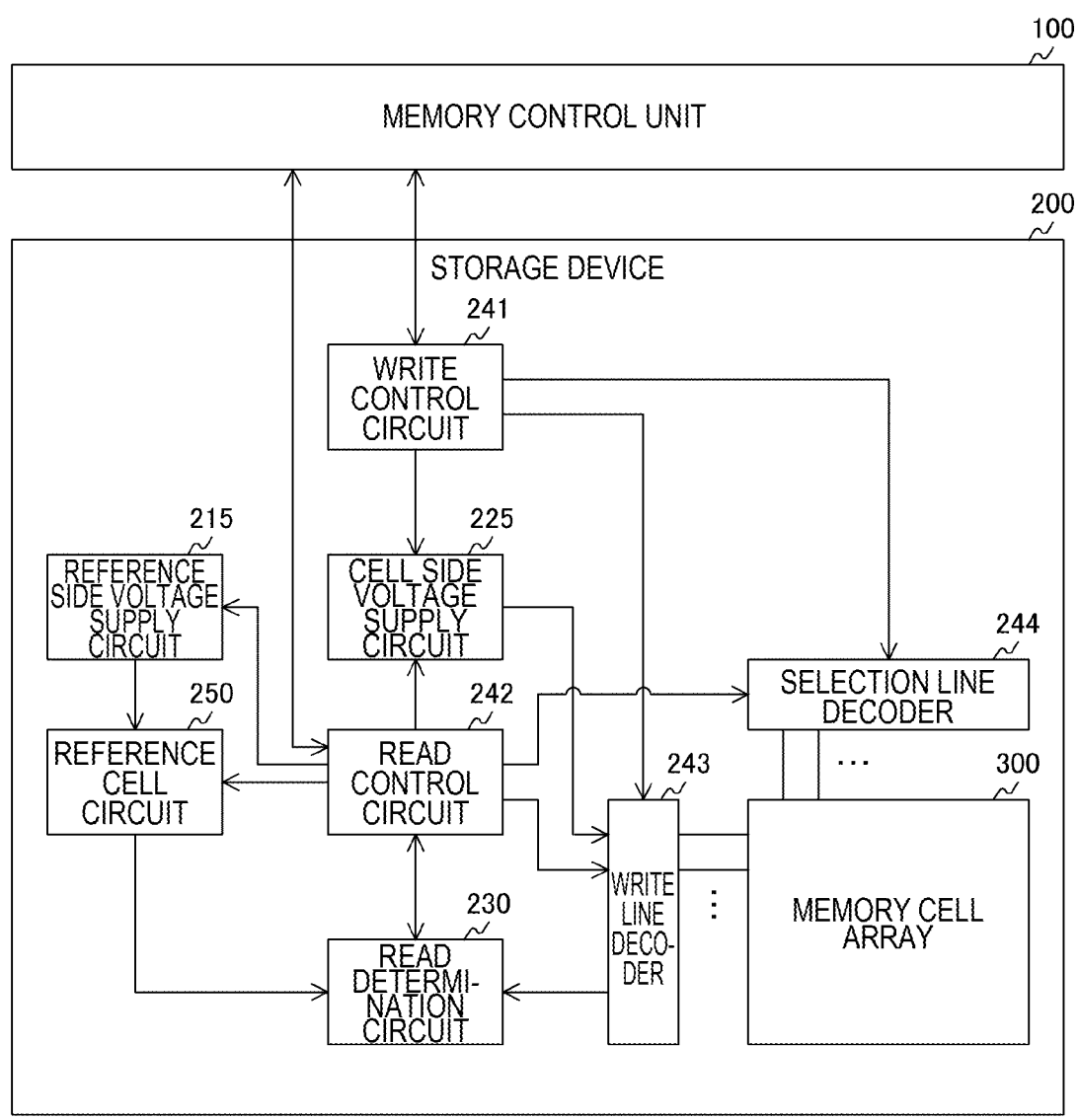
FIG. 13 is block diagram illustrating a configuration example of an information processing apparatus according to a second embodiment of the present technology.

FIG. 13 is block diagram illustrating a configuration example of an information processing apparatus according to the second embodiment. The storage device 200 of the second embodiment differs from the first embodiment in that the storage device 200 includes a reference side voltage supply circuit 215 and a cell side voltage supply circuit 225 instead of the reference side current source circuit 210 and the cell side current source circuit 220.

The reference side voltage supply circuit 215 supplies an initialization voltage $V_{ini}$ and a reference side read voltage $V_{read1}$ in this order to the reference cell circuit 250 in accordance with the control of the read control circuit 242. The initialization voltage $V_{ini}$ is a voltage in which current larger than the reversal threshold Th flows to the reference cell, and the reference side read voltage $V_{read1}$ is a voltage in which current less than or equal to the reversal threshold Th flows to the reference cell.

The cell side voltage supply circuit 225 inputs a write voltage $V_{write}$ or a cell side read voltage $V_{read2}$ to the write line decoder 243 in accordance with the control of the write control circuit 241 or the read control circuit 242. The value of the write voltage $V_{write}$ is the same as the initialization voltage $V_{ini}$, and the value of the cell side read voltage $V_{read2}$ is the same as the reference side read voltage $V_{read1}$.

Figure 14:
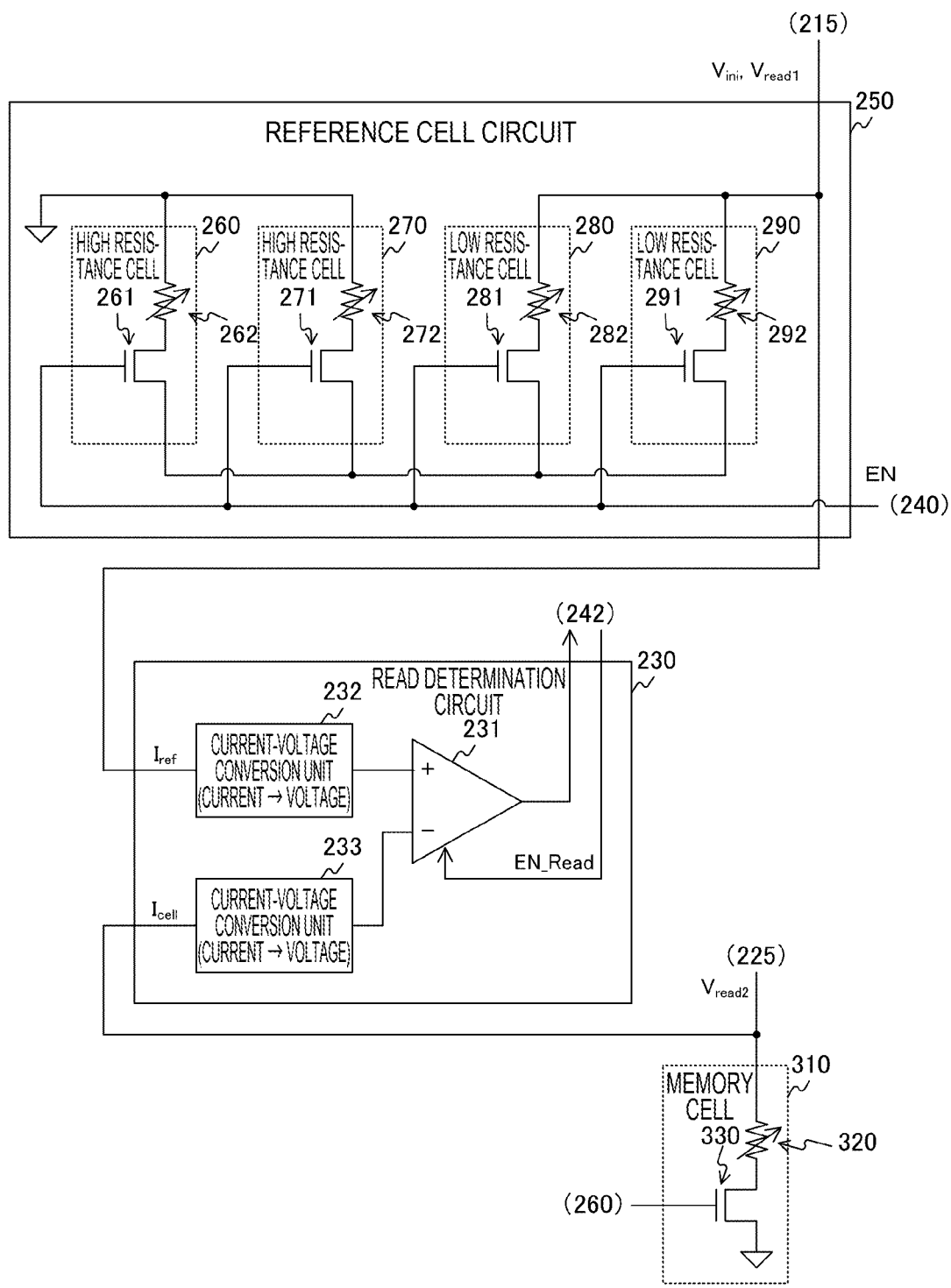
FIG. 14 is a circuit diagram illustrating a configuration example of a reference cell circuit and a read determination circuit according to the second embodiment of the present technology.

FIG. 14 is a circuit diagram illustrating a configuration example of the reference cell circuit 250 and the read determination circuit 230 according to the second embodiment. The read determination circuit 230 of this second embodiment includes current-voltage conversion units 232 and 233.

When the reference side read voltage $V_{read1}$ is input, the reference cell circuit 250 of the second embodiment generates a reference current $I_{ref}$ corresponding to the combined resistance and outputs this reference current $I_{ref}$ to the current-voltage conversion unit 232. Also, when the cell side read voltage $V_{read2}$ is input, the memory cell 310 generates a cell current $I_{cell}$ corresponding to the resistance value and outputs this cell current $I_{cell}$ to the current-voltage conversion unit 232.

The current-voltage conversion units 232 and 233 convert current to voltage. For example, current conveyor circuits are used as the current-voltage conversion units 232 and 233. The current-voltage conversion unit 232 outputs voltage corresponding to the reference current $I_{ref}$ to the non-reversing input terminal (+) of the sense amplifier 231. Also, the current-voltage conversion unit 233 outputs voltage corresponding to the cell current $I_{cell}$ to the reversing input terminal (−) of the sense amplifier 231.

Note that the configuration of the first modified example or the second modified example can also be applied to the storage device 200 of the second embodiment.

In this way, according to the second embodiment of the present technology, the reference side current source circuit 210 applies the reference side read voltage to the reference cell after inputting the initialization voltage, so the reference cell can be initialized by the application of voltage right before reading. As a result, the storage device 200 is able to accurately read the read data even if the resistance value of the reference cell has changed to a value that is different from the initial value before reading.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that effects described herein are not necessarily limitative, and any effect that is desired to be described in the present disclosure may be admitted.

Additionally, the present technology may also be configured as below (1)
A storage device including:
a reference cell circuit in which a resistance value changes to a predetermined initial value when an initialization signal exceeding a predetermined reversal threshold is input;
a reference side signal source that inputs a reference side read signal of a predetermined value not exceeding the predetermined reversal threshold to the reference cell circuit after the initialization signal is input to the reference cell circuit when there is an instruction to read with respect to a memory cell;
a cell side signal source that inputs a cell side read signal of the predetermined value to the memory cell after the initialization signal is input; and
a comparison unit that compares a reference signal output from the reference cell circuit into which the reference side read signal has been input, and a cell signal output from the memory cell into which the cell side read current has been input, and acquires the comparison result as read data.

(2)
The storage device according to (1), in which
the reference cell circuit includes a plurality of reference cells, and
a combined resistance of the resistance values of each of the plurality of reference cells changes to the initial value with the initialization signal.

(3)
The storage device according to (2), in which
the reference cell circuit includes a plurality of first reference cells connected in parallel between the reference side read signal source and a connection point, and a plurality of second reference cells connected in parallel between the connection point and a ground terminal, and
the resistance values of each of the first reference cells and each of the second reference cells are initialized to different values when the initialization signal is input.

(4)
The storage device according to (2), in which
the reference cell circuit includes a plurality of circuit blocks connected in parallel between the reference side signal source and a ground terminal,
each of the plurality of circuit blocks includes a first reference cell and a second reference cell connected in series, and
the resistance values of each of the first resistance cell and the second resistance cell are initialized to different values when the initialization signal is input.

(5)
The storage device according to any of (1) to (4), further including:
a memory cell array in which a predetermined number of the memory cells are arranged in a two-dimensional lattice pattern,
in which the reference side signal source inputs the initialization signal each time there is an instruction to read with respect to the predetermined number of memory cells arranged in a predetermined direction.

(6)
The storage device according to any of (1) to (6), in which
the initialization signal, the reference side read signal, and the cell side read signal are current signals, and the reference signal and the cell signal are voltage signals.

(7)
The storage device according to any of (1) to (5), in which
the initialization signal, the reference side read signal, and the cell side read signal are voltage signals, and the reference signal and the cell signal are current signals.

(8)
The storage device according to any of (1) to (7), in which
the reference cell circuit and the memory cell are MTJ elements.

(9)
An information processing apparatus including:
a memory control unit that gives an instruction to read with respect to a memory cell;
a reference cell circuit in which a resistance value changes to a predetermined initial value when an initialization signal exceeding a predetermined reversal threshold is input;
a reference side signal source that inputs a reference side read signal of a predetermined value not exceeding the predetermined reversal threshold to the reference cell circuit after the initialization signal is input to the reference cell circuit when the instruction to read is given;
a cell side signal source that inputs a cell side read signal of the predetermined value to the memory cell after the initialization signal is input; and a comparison unit that compares a reference signal output from the reference cell circuit into which the reference side read signal has been input, and a cell signal output from the memory cell into which the cell side read current has been input, and acquires the comparison result as read data.

(10) A control method for a storage device, including:

a reference side signal inputting step for inputting, to a reference cell circuit in which a resistance value changes to a predetermined initial value when the initialization signal exceeding a predetermined reversal threshold is input, a reference side read signal of a predetermined value not exceeding the predetermined reversal threshold, after the initialization signal is input to the reference cell circuit, when there is an instruction to read with respect to a memory cell;

a cell side signal inputting step for inputting a cell side read signal of the predetermined value to the memory cell after the initialization signal is input; and a comparing step for comparing a reference signal output from the reference cell circuit into which the reference side read signal has been input, and a cell signal output from the memory cell into which the cell side read current has been input, and acquires the comparison result as read data.

REFERENCE SIGNS LIST 100 memory control unit
200 storage device
210 reference side current source circuit
211 reference side current source
215 reference side voltage supply circuit
220 cell side current source circuit
221 cell side current source
225 cell side voltage supply circuit
230 read determination circuit
231 sense amplifier
232, 233 current-voltage conversion unit
241 write control circuit
242 read control circuit
243 write line decoder
244 selection line decoder
250 reference cell circuit
260, 270 high resistance cell
261, 271, 281, 291, 330 transistor
262, 272, 282, 292, 320 MTJ element
280, 290 low resistance cell
300 memory cell array
310 memory cell
321, 325 electrode layer
322 free magnetic layer
323 tunnel barrier layer
324 pinned magnetic layer

What is claimed is:

1. A storage device comprising:
a reference cell circuit in which a resistance value changes to a predetermined initial value when an initialization signal exceeding a predetermined reversal threshold is input;
a reference side signal source that inputs a reference side read signal of a predetermined value not exceeding the predetermined reversal threshold to the reference cell circuit after the initialization signal is input to the reference cell circuit when there is an instruction to read a memory cell;
a cell side signal source that inputs a cell side read signal of the predetermined value to the memory cell after the initialization signal is input; and
a comparison unit that compares a reference signal output from the reference cell circuit into which the reference side read signal has been input, and a cell signal output from the memory cell into which the cell side read signal has been input, and acquires the comparison result as read data.

2. The storage device according to claim 1, wherein the reference cell circuit includes a plurality of reference cells, and
a combined resistance of resistance values of the plurality of reference cells changes to the initial value with the initialization signal.

3. The storage device according to claim 2, wherein the plurality of reference cells includes a plurality of first reference cells connected in parallel between the reference side read signal source and a connection point, and a plurality of second reference cells connected in parallel between the connection point and a ground terminal, and
resistance values of each of the first reference cells and each of the second reference cells are initialized to different values when the initialization signal is input.

4. The storage device according to claim 2, wherein the reference cell circuit includes a plurality of circuit blocks connected in parallel between the reference side signal source and a ground terminal,
each of the plurality of circuit blocks includes a first reference cell and a second reference cell connected in series, and
resistance values of each of the first resistance cell and the second resistance cell are initialized to different values when the initialization signal is input.

5. The storage device according to claim 1, further comprising:
a memory cell array in which a predetermined number of memory cells are arranged in a two-dimensional lattice pattern,
wherein the reference side signal source inputs the initialization signal each time there is an instruction to read the predetermined number of memory cells arranged in a predetermined direction.

6. The storage device according to claim 1, wherein the initialization signal, the reference side read signal, and the cell side read signal are current signals, and the reference signal and the cell signal are voltage signals.

7. The storage device according to claim 1, wherein the initialization signal, the reference side read signal, and the cell side read signal are voltage signals, and the reference signal and the cell signal are current signals.

8. The storage device according to claim 1, wherein the reference cell circuit and the memory cell are magnetic tunnel junction (MTJ) elements.

9. An information processing apparatus comprising:
a memory control unit that gives an instruction to read a memory cell;
a reference cell circuit in which a resistance value changes to a predetermined initial value when an initialization signal exceeding a predetermined reversal threshold is input;
a reference side signal source that inputs a reference side read signal of a predetermined value not exceeding the predetermined reversal threshold to the reference cell circuit after the initialization signal is input to the reference cell circuit when the instruction to read is given;

a cell side signal source that inputs a cell side read signal of the predetermined value to the memory cell after the initialization signal is input; and a comparison unit that compares a reference signal output from the reference cell circuit into which the reference side read signal has been input, and a cell signal output from the memory cell into which the cell side read signal has been input, and acquires the comparison result as read data.

10. A control method for a storage device, comprising:

a reference side signal inputting step for inputting, to a reference cell circuit in which a resistance value changes to a predetermined initial value when an initialization signal exceeding a predetermined reversal threshold is input, a reference side read signal of a predetermined value not exceeding the predetermined reversal threshold, after the initialization signal is input to the reference cell circuit, when there is an instruction to read a memory cell;

a cell side signal inputting step for inputting a cell side read signal of the predetermined value to the memory cell after the initialization signal is input; and a comparing step for comparing a reference signal output from the reference cell circuit into which the reference side read signal has been input, and a cell signal output from the memory cell into which the cell side read signal has been input, and acquires the comparison result as read data.

11. The information processing apparatus according to claim 9, wherein the reference cell circuit includes a plurality of reference cells, and a combined resistance of resistance values of the plurality of reference cells changes to the initial value with the initialization signal.

12. The information processing apparatus according to claim 11, wherein the plurality of reference cells includes a plurality of first reference cells connected in parallel between the reference side read signal source and a connection point, and a plurality of second reference cells connected in parallel between the connection point and a ground terminal, and resistance values of each of the first reference cells and each of the second reference cells are initialized to different values when the initialization signal is input.

13. The information processing apparatus according to claim 11, wherein the reference cell circuit includes a plurality of circuit blocks connected in parallel between the reference side signal source and a ground terminal, each of the plurality of circuit blocks includes a first reference cell and a second reference cell connected in series, and resistance values of each of the first resistance cell and the second resistance cell are initialized to different values when the initialization signal is input.

14. The information processing apparatus according to claim 9, further comprising:

a memory cell array in which a predetermined number of memory cells are arranged in a two-dimensional lattice pattern, wherein the reference side signal source inputs the initialization signal each time there is an instruction to read the predetermined number of memory cells arranged in a predetermined direction.

15. The information processing apparatus according to claim 9, wherein the initialization signal, the reference side read signal, and the cell side read signal are current signals, and the reference signal and the cell signal are voltage signals.

16. The information processing apparatus according to claim 9, wherein the initialization signal, the reference side read signal, and the cell side read signal are voltage signals, and the reference signal and the cell signal are current signals.

17. The information processing apparatus according to claim 9, wherein the reference cell circuit and the memory cell are magnetic tunnel junction (MTJ) elements.

18. The control method for a storage device according to claim 10, wherein the initialization signal, the reference side read signal, and the cell side read signal are current signals, and the reference signal and the cell signal are voltage signals.

19. The control method for a storage device according to claim 10, wherein the initialization signal, the reference side read signal, and the cell side read signal are voltage signals, and the reference signal and the cell signal are current signals.

20. The control method for a storage device according to claim 10, wherein the reference cell circuit and the memory cell are magnetic tunnel junction (MTJ) elements.

* * * * *